United States Patent
Glaser et al.

(10) Patent No.: US 11,019,718 B2
(45) Date of Patent: May 25, 2021

(54) LOW PARASITIC INDUCTANCE STRUCTURE FOR POWER SWITCHED CIRCUITS

(71) Applicant: Efficient Power Conversion Corporation, El Segundo, CA (US)

(72) Inventors: John S. Glaser, Niskayuna, NY (US); Michael A. de Rooij, Playa Vista, CA (US)

(73) Assignee: Efficient Power Conversion Corporation, El Segundo, CA (US)

(*) Notice: Subject to any disclaimer, the term of this patent is extended or adjusted under 35 U.S.C. 154(b) by 0 days.

(21) Appl. No.: 15/930,033

(22) Filed: May 12, 2020

(65) Prior Publication Data
US 2020/0367354 A1 Nov. 19, 2020

Related U.S. Application Data

(60) Provisional application No. 62/848,073, filed on May 15, 2019.

(51) Int. Cl.
*H05K 1/02* (2006.01)
*H05K 1/18* (2006.01)
*H01L 29/20* (2006.01)

(52) U.S. Cl.
CPC ......... *H05K 1/0213* (2013.01); *H05K 1/0218* (2013.01); *H05K 1/18* (2013.01); *H01L 29/2003* (2013.01); *H05K 2201/0792* (2013.01); *H05K 2201/09227* (2013.01); *H05K 2201/09609* (2013.01); *H05K 2201/10015* (2013.01); *H05K 2201/10166* (2013.01)

(58) Field of Classification Search
CPC .............. H05K 1/0213; H05K 1/0215; H05K 1/0216; H05K 1/0218; H05K 1/023; H05K 1/0231; H05K 2201/0792; H05K 2201/09227; H05K 2201/09226; H05K 2201/09606
See application file for complete search history.

(56) References Cited

U.S. PATENT DOCUMENTS

| | | | |
|---|---|---|---|
| 6,215,679 B1* | 4/2001 | Yamane | H02M 7/003 257/E25.029 |
| 9,035,417 B2 | 5/2015 | Reusch et al. | |
| 2011/0220979 A1* | 9/2011 | Kawashima | H01L 27/0694 257/296 |
| 2013/0157482 A1* | 6/2013 | Barber | H01L 23/50 439/88 |

(Continued)

*Primary Examiner* — Hoa C Nguyen
(74) *Attorney, Agent, or Firm* — Blank Rome LLP

(57) ABSTRACT

A highly efficient, multi-layered, single component sided circuit board layout design providing reduced parasitic inductance for power switched circuits. Mounted on the top board are one or more transistor switches, one or more loads, and one or more capacitors. The switches and capacitors form a loop with very low parasitic inductance. The loads may be a part of the loop, i.e. in series with the switches and capacitors, or may be connected to two or more nodes of the loop to form additional loops with common vertices. Parallel wide conductors carry the switch load current resulting in a low inductance path for the power loop. The power loop and gate loop current travel in opposite directions and are well separated, minimizing common source inductance (CSI) and maximizing switching speed.

7 Claims, 10 Drawing Sheets

(56) References Cited

U.S. PATENT DOCUMENTS

| | | | |
|---|---|---|---|
| 2015/0131190 A1* | 5/2015 | Barber | H02H 9/04 |
| | | | 361/111 |
| 2016/0086723 A1* | 3/2016 | Su | H01F 17/0033 |
| | | | 336/200 |
| 2016/0308330 A1* | 10/2016 | Liffran | H01S 5/0428 |
| 2016/0352247 A1* | 12/2016 | Li | H01L 23/49838 |
| 2018/0007785 A1* | 1/2018 | Kamikura | H05K 1/0218 |
| 2018/0123476 A1* | 5/2018 | Schutten | H05K 1/0218 |
| 2018/0206359 A1* | 7/2018 | McPherson | H02M 3/158 |
| 2020/0288562 A1* | 9/2020 | Okagawa | H02M 3/1588 |

* cited by examiner

LOW PARASITIC INDUCTANCE STRUCTURE FOR POWER SWITCHED CIRCUITS

This application claims the benefit of U.S. Provisional Application 62/848,073 filed on May 15, 2019, the contents of which are herein incorporated by reference.

BACKGROUND OF THE INVENTION

1. Field of the Invention

The present invention relates generally to circuit boards for power switched circuits and, more particularly, to circuit board layouts for improving power switching circuit performance.

2. Description of the Related Art

The improvement of power field effect transistor (FET) technologies such as silicon metal oxide semiconductor FETs and the introduction of wide bandgap semiconductors such as gallium nitride (GaN) based transistors allow switching power circuits to achieve faster switching speeds by reducing switching related charges and package parasitic inductance. With higher switching speeds, the circuit board layout of power switched circuits becomes a limiting factor in performance because the layout of components has a significant effect on the overall level of parasitic inductance, which has a generally detrimental effect on switching performance, including switching speed and EMI generation. An improved circuit board layout is needed to both minimize total parasitic inductance in a multilayer circuit board design and to arrange the remaining areas of parasitic inductance in a manner that improves power switched circuit performance

SUMMARY OF THE INVENTION

The present invention provides a circuit board layout for a power switched circuit with very low parasitic inductance, with the remaining parasitic inductance located within the circuit in a manner that minimizes the impact on switching performance. Specifically, the circuit board of the present invention includes a first layer on which a transistor switch, the load and the bus capacitor of the power switched circuit are mounted, the first layer being the outer layer of the circuit board. The capacitor is mounted between, and separated from, the load and the transistor switch. The first layer of the circuit board includes first conductors for carrying the switch load current in a first direction, and second conductors, apart from the first conductors, for carrying the gate drive current in an opposite direction, thereby minimizing common source inductance and maximizing switching speed.

The circuit board also includes a second layer, disposed adjacent the outer layer, which includes conductors, directly underneath the first conductors, for carrying the switch load current in an opposite direction to the first direction. Vias are disposed under the transistor switch and the load for connecting the first conductors of the first layer with the conductors of the second layer, thereby forming a power loop extending through the outer layer and the layer beneath the outer layer. The parallel wide conductors carrying switch load current, with the switch load current flowing on the outer layer and the beneath the outer layer in overlaying, opposite directions, reduces total parasitic inductance.

The first (outer) layer and the second (adjacent) layer each comprise a ground plane. Vias connect the ground plane of the outer layer to the ground plane of the beneath the outer layer. A portion of these vias are disposed directly under the gate drive. An optional third layer comprising a ground plane can also be connected by vias to the ground plane of the outer layer and the ground plane of the adjacent layer by the ground vias.

The circuit board of the present invention can be used for implementing a single switch and load circuit or a half-bridge circuit.

BRIEF DESCRIPTION OF THE DRAWINGS

The features, objects, and advantages of the present disclosure will become more apparent from the detailed description set forth below when taken in conjunction with the drawings in which like reference characters identify correspondingly elements and in which.

DETAILED DESCRIPTION OF THE PREFERRED EMBODIMENTS

In the following detailed description, reference is made to certain embodiments. These embodiments are described with sufficient detail to enable those skilled in the art to practice them. It is to be understood that other embodiments may be employed and that various structural, logical, and electrical changes may be made.

The present invention, as described below, provides a multilayered circuit board design for power switched circuits with reduced parasitic inductance.

While embodiments described herein are described and shown in connection with certain types of transistor switches, specifically GaN transistors, it should be understood that the invention is not so limited. For example, the described embodiments may be applicable to transistor devices and other types of semiconductor devices that use different conductive materials, such as, for example, silicon (Si) or silicon-containing materials, grapheme, germanium (Ge), gallium arsenide (GaAs). Described embodiments are also applicable to other types of semiconductor devices, such as other field effect transistor (FET)-type semiconductor devices, bipolar junction transistor (BJT) devices, and insulated-gate bipolar transistor (IGBT) devices. The described concepts are also equally applicable to both enhancement mode and depletion mode transistor devices. In addition, while specific embodiments are described in connection with particular switching circuits, it should be understood that features described herein are generally applicable to other types of circuits, such as RF amplifiers, switching converters, other power converters and other circuits.

Figure 1:
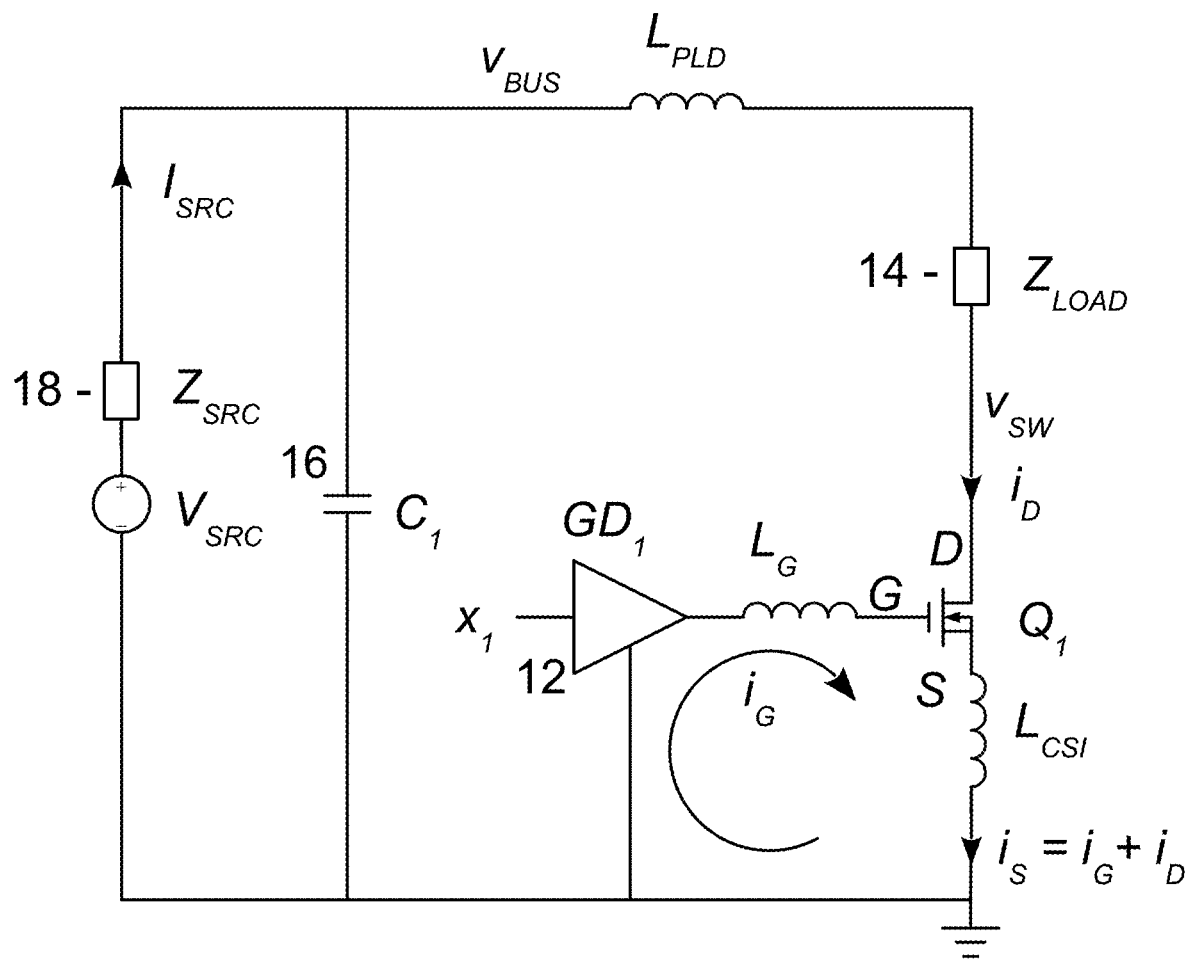
FIG. 1 is a schematic of a circuit for a single transistor switch with a load.

Referring now to the drawings, FIG. 1 is a schematic of a circuit for a single transistor switch with a load. The power switch circuit includes a transistor switch 10, gate driver 12, load 14, capacitor 16, and voltage source 18. Transistor switch 10 is preferably a GaN power transistor as shown.

FIG. 1 further shows the dominant parasitic inductances $L_{PLD}$, $L_G$, and $L_{CSI}$. Those skilled in the art understand that these represent inductances due to the storage of energy in the magnetic field surrounding conductors and components through which current flows, and are not components physically placed on the circuit board by a designer. It is further understood that these inductances must be non-zero for real physical current-carrying structures of non-zero volume. During switching transitions, it will be appreciated that, in a well-designed circuit, the AC component of current $I_{SRC}$ will be very small compared to the current $i_D$, thus it is a reasonable approximation to assume that $I_{SRC}$ can be neglected during switching transitions. During switching transitions, there are two current loops of relevance; the power loop comprised of $C_1$, $L_{PLD}$, $Z_{LOAD}$, $Q_1$, and $L_{CSI}$; and the gate loop comprised of $GD_1$, $L_G$, $Q_1$, and $L_{CSI}$. It is also understood that these three inductances are lumped representations of inductance that physically may be distributed about the loop relevant loop.

Figure 2A:
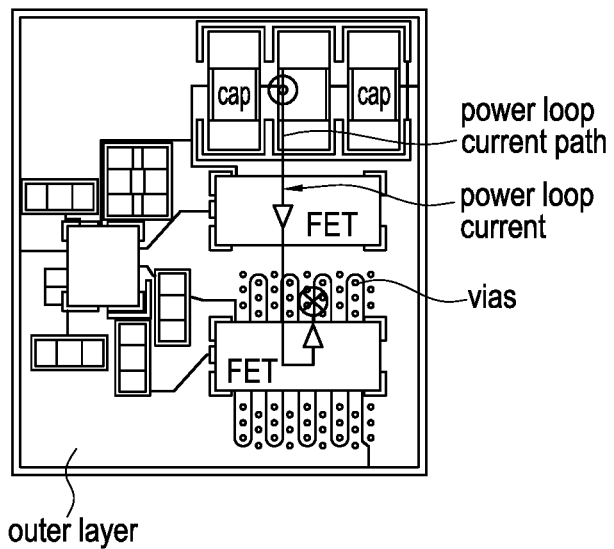
FIGS. 2A-2C show a prior art circuit board layout to minimize power loop inductance.
Figure 2B:
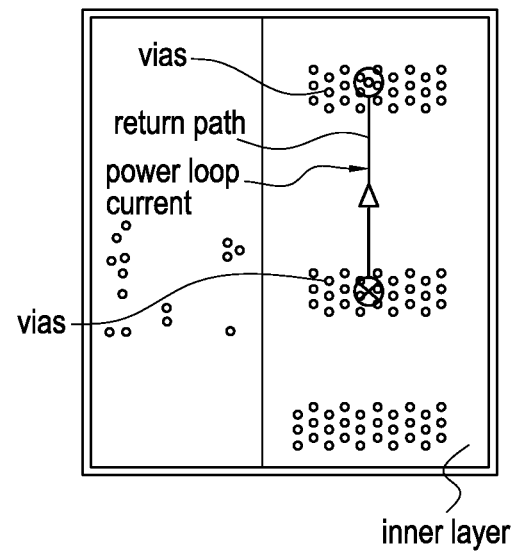
Figure 2C:
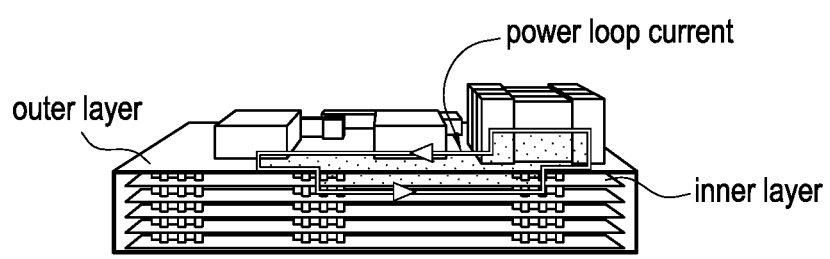

FIGS. 2A-2C show a prior art circuit board layout disclosed in U.S. Pat. No. 9,035,417, incorporated by reference herein, which is designed to minimize the power loop inductance. The same principles are applied in the present invention to minimize the gate loop inductance. Common source inductance has typically been dominated by the package of the transistor, and may be reduced substantially by the use of a chip-scale package. Note that the prior art places components on an outer layer, and the adjacent inner conductor layer comprises a ground or reference plan, where any AC voltage is approximately zero. The use of an inner layer ground plane is common in high speed electronic designs.

Figure 3:
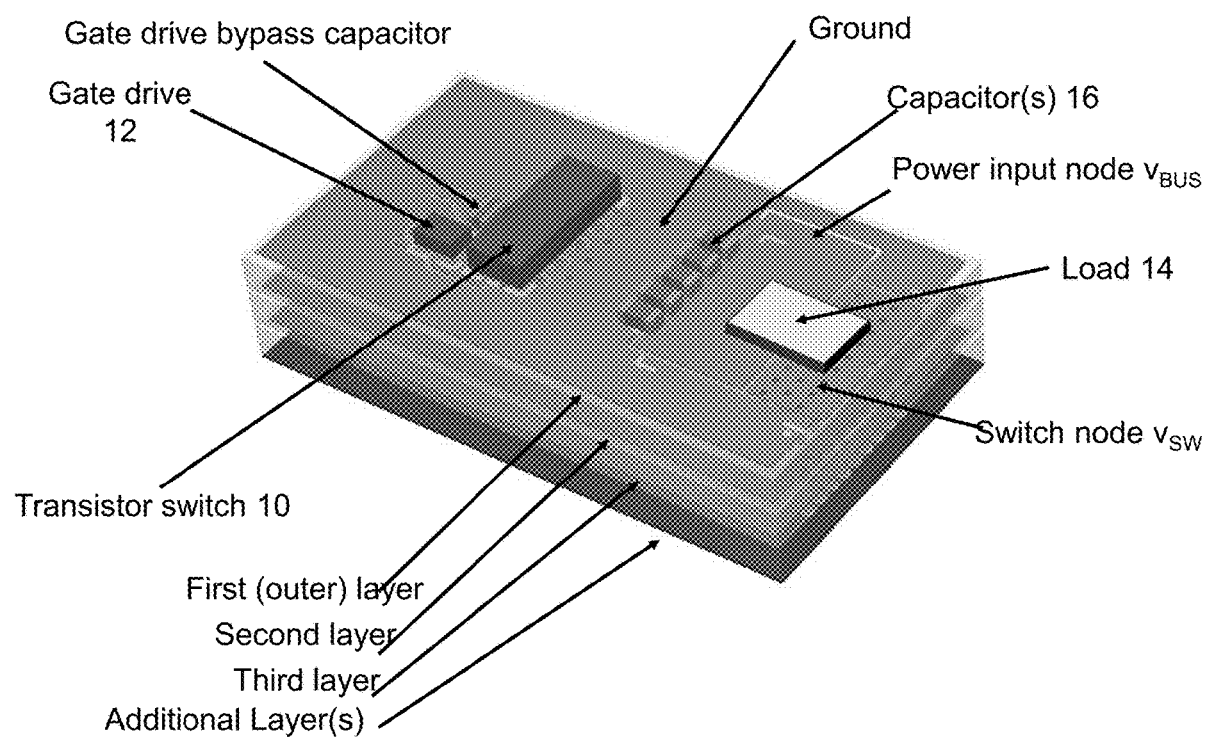
FIG. 3 shows the board layout of the present invention for the circuit of FIG. 1.

FIG. 3 shows the board layout of the present invention for the circuit of FIG. 1, with the components mounted on the board. As can be seen, the transistor switch 10 and the gate drive 12 are located together on the left side of the board, with a gate drive bypass capacitor 22. Load 14 is located on the right side of the board with switch node $v_{SW}$. Capacitor(s) 16 is located centrally on the board between the transistor switch 10/gate driver 12 and load 14, and is connected to power input node $V_{BUS}$, which charges the capacitor(s). Load 14 is connected to power input node $V_{BUS}$ on the left side and to switch node $v_{SW}$ on the right side. As shown in FIG. 3, the circuit board has multiple layers, including at least a first (outer) layer and a second layer, and, optionally, a third layer and additional layers.

Figure 4:
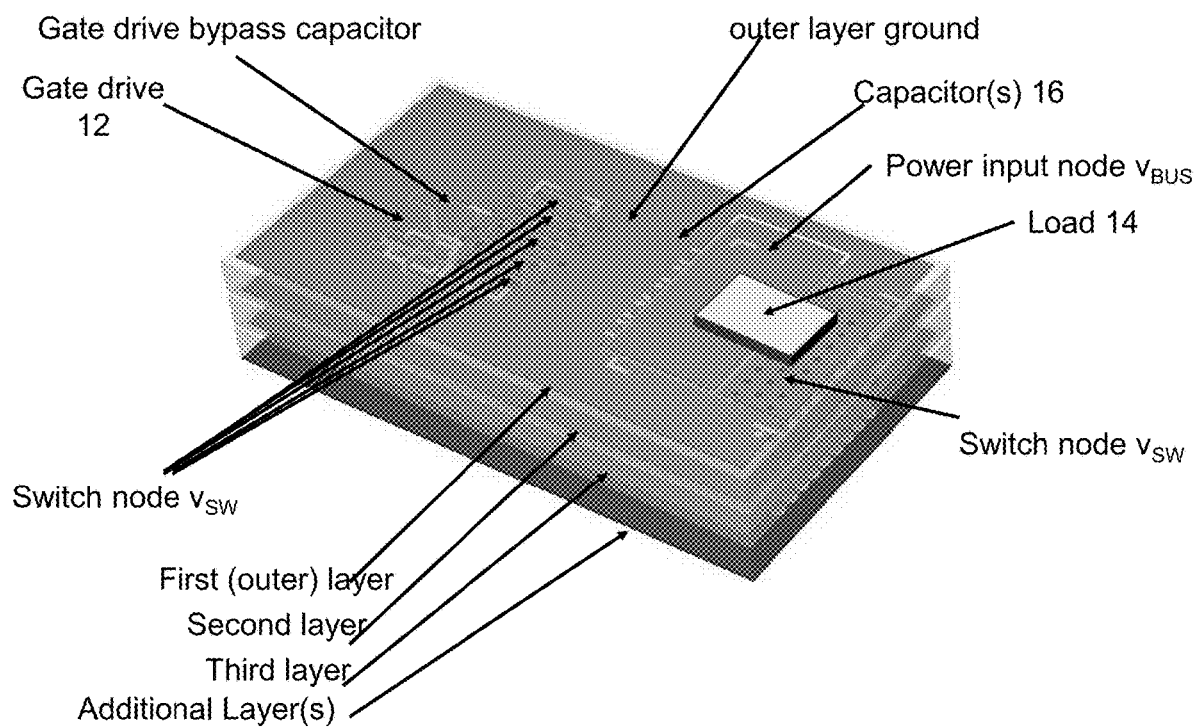
FIG. 4 shows the layout of the first (outer) layer of the circuit board, but without the transistor switch and the gate drive components mounted on the board.

FIG. 4 shows the layout of the first (outer) layer and is similar to FIG. 3, but without the transistor switch 10 and the gate drive 12 components mounted on the board, revealing the switch node $v_{SW}$ under the transistor switch 10. In a difference from prior art, the first (outer) layer of the circuit board is a ground plane in the area of transistor switch 10 and capacitors(s) 16, hence it has approximately zero AC voltage. Between the capacitors and the load is a power plane connected to node $V_{BUS}$, which also has approximate zero AC voltage. Advantageously, the majority of the first (outer) layer has approximately zero AC voltage, removing a significant source of EMI due to a reduction in E-field coupling to adjacent structures.

Figure 5:
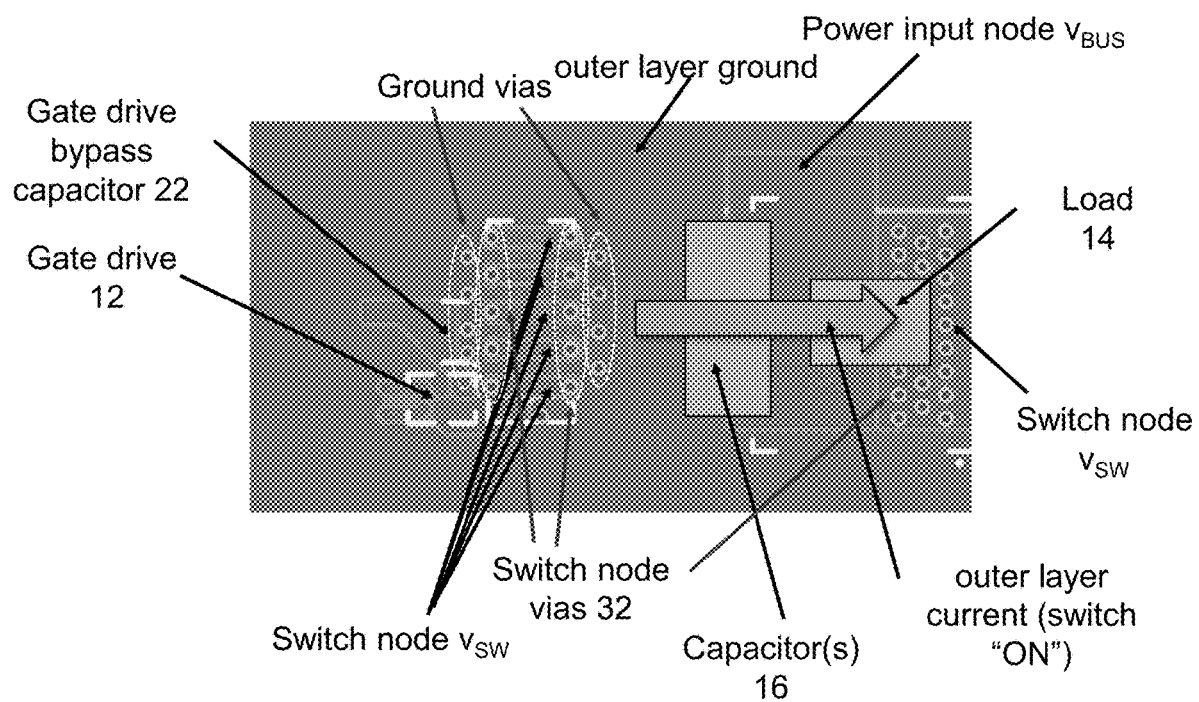
FIG. 5 shows the power loop on the first (outer) layer of the circuit board.

FIG. 5 shows the power loop on the first (outer) layer of the circuit board. When transistor switch 10 is turned on, the power loop current flows to the right out of the capacitor(s) 16, through load 14, and down through switch node vias 32 adjacent to load 14. Power loop current also flows from ground vias and the source terminals of Q1 into the left terminal of the capacitor(s) 16.

Figure 6:
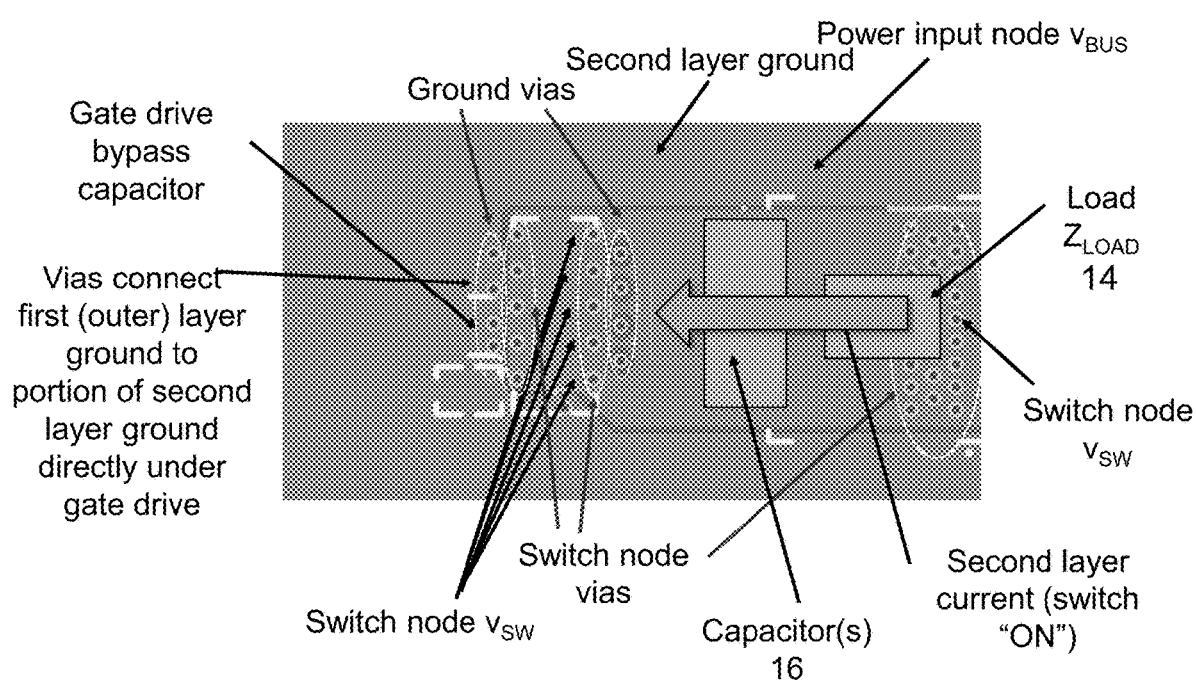
FIG. 6 shows the path of the flow of current in the power loop in the second layer of the circuit board.

FIG. 6 shows the path of the flow of current in the power loop in the second layer of the circuit board. As shown, in the second layer, the power loop current from the load 14, after traveling down through the vias 32, travels left and then up through switch node vias 34 adjacent to the transistor switch 10. The power loop current then flows through the transistor switch 10 and returns to ground in the top layer. Advantageously, the magnetic effect of the power loop path of the top layer is self-canceled by the opposing direction of the return path of the power loop current flow in the second layer, which is directly underneath the top layer. See U.S. Pat. No. 9,035,417. Additionally, the parallel wide conductors carrying the switch load current result in a low inductance path for the power loop.

FIG. 6 also shows a group of ground vias 34 on the left side of the circuit board which connects the first layer ground to a portion of the second layer ground directly under the gate drive. Advantageously, this allows additional circuitry to use a second layer ground plane as is commonly done to simplify the layout of complex circuitry.

Figure 7:
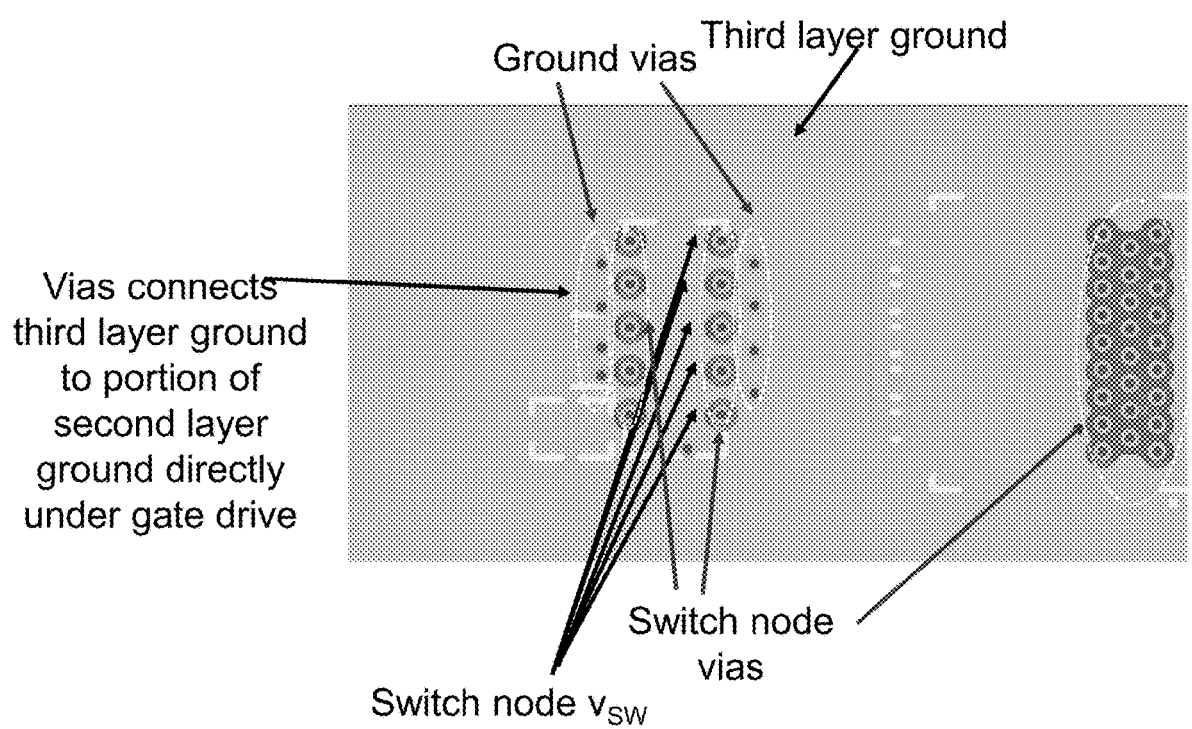
FIG. 7 shows an optional third layer of the circuit board of the present invention.

FIG. 7 shows an optional third layer of the circuit board of the present invention. The third layer is a ground layer, and is connected by vias to the ground planes in the first and second layers of the circuit board. The ground plane on the third layer further reduces power loop inductance and provides E-field shielding of the switch node on the side opposite the first (outer) layer. The switch node is thereby shielded by ground planes above and below to minimize EMI.

Figure 8:
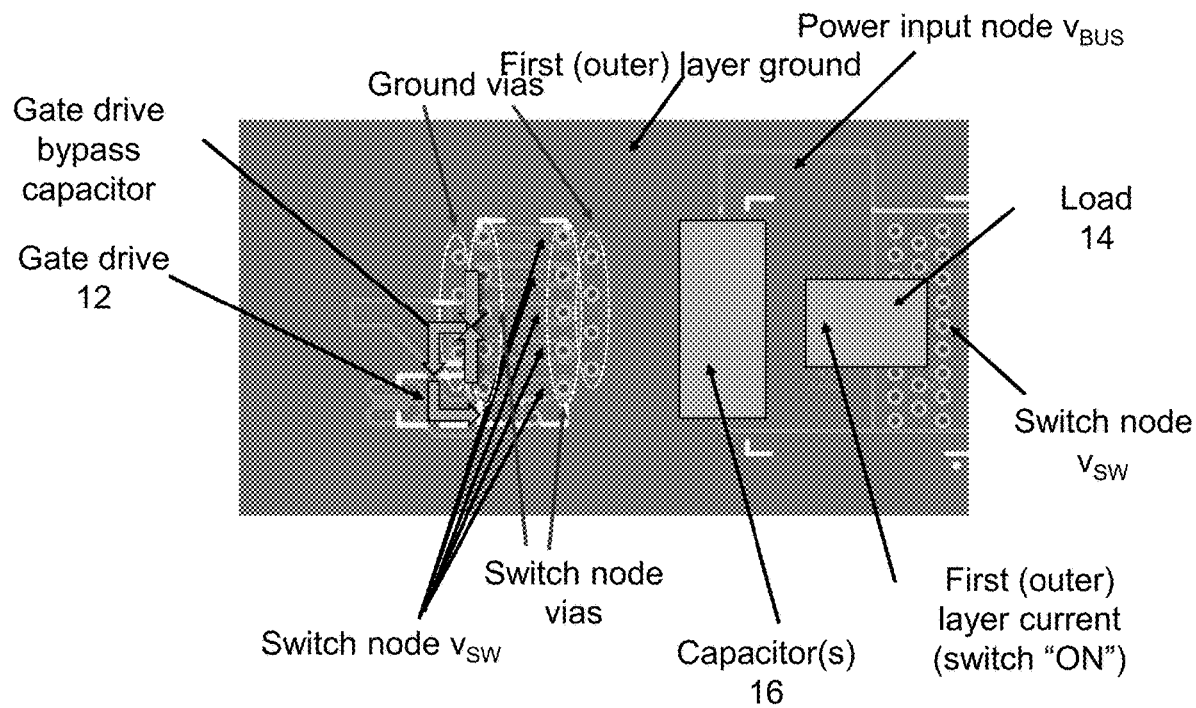
FIG. 8 shows the gate loop on the first (outer) layer of the circuit board.

FIG. 8 shows the gate loop on the first (outer) layer of the circuit board. As shown, when transistor switch 10 is turned on, the gate current flows to the left, out of the gate drive bypass capacitor 16 on layer 1, through gate drive, and then right, into the gate of transistor switch 10. The gate current then exits the transistor switch ground terminals and travels left, back into capacitor 16. The transistor switch ground is tied through ground vias to a ground plane under the gate drive. Since the gate loop is not in the power loop, it does not contribute to common source inductance. Importantly, on the top layer of the board, the gate loop current and the power loop current travel in different (opposite) directions and are well separated, minimizing common source inductance (CSI) and maximizing switching speed. The gate loop current does not travel through any vias and is present only on the top layer of the board. In the prior art where power loop inductance is minimized via the use of a second layer ground plane, power loop current must travel through vias to get from Q1 to the ground plane. In prior art, gate current often flows through these vias as well, this contributes to common source inductance and slows the turn-on transition. Furthermore, in the rare prior art cases that the gate drive current does not flow through the vias, the power loop current causes ground bounce, which can contribute to false or otherwise erroneous triggering of the gate drive. Hence, the invention reduces common source inductance and ground bounce problems simultaneously.

Figure 9:
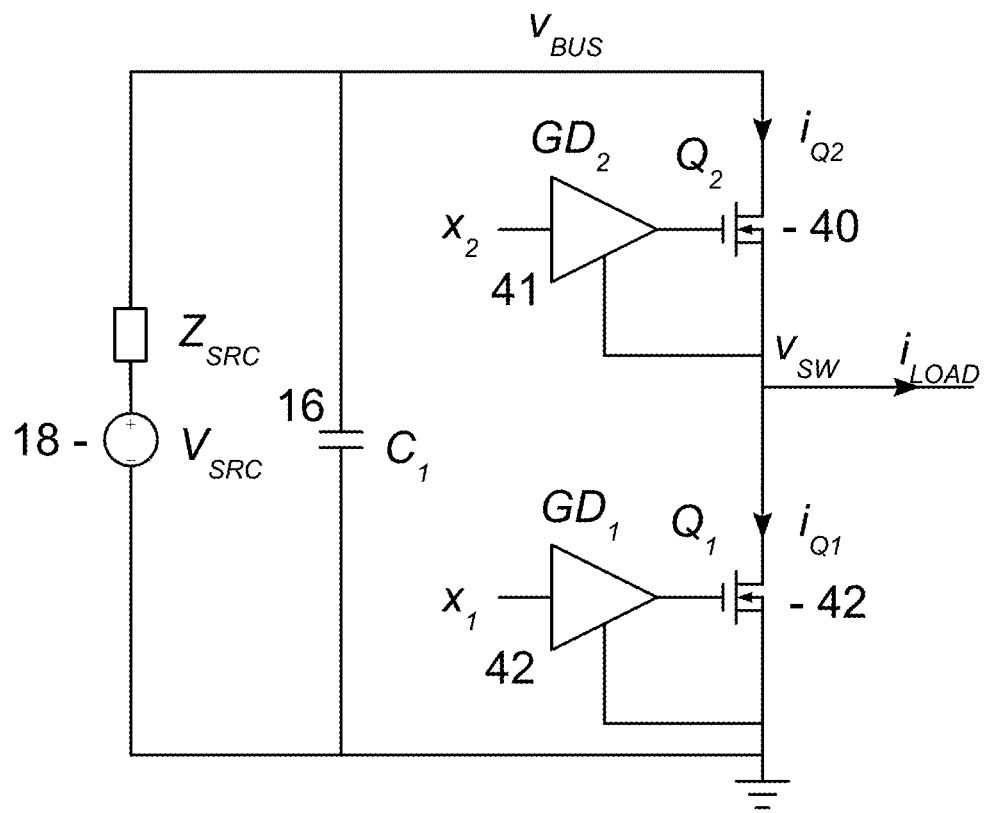
FIG. 9 is a circuit diagram of a half-bridge variant of the present invention.

FIG. 9 is a circuit diagram of a half-bridge variant of the present invention. The half-bridge circuit includes high side transistor switch 40 and low side transistor switch 42, and associated gate drives 41 and 43, respectively. The key differences contributed by the half-bridge variant are that the load in FIG. 8 is replaced with switch 40 with optionally its own gate drive, such that the switch node may be connected through 40 to the node v_BUS or through 42 to the ground node, and that the load current now travels from the switch node to the outside of the power loop, while the switching transition currents remain in the power loop as before.

Figure 10:
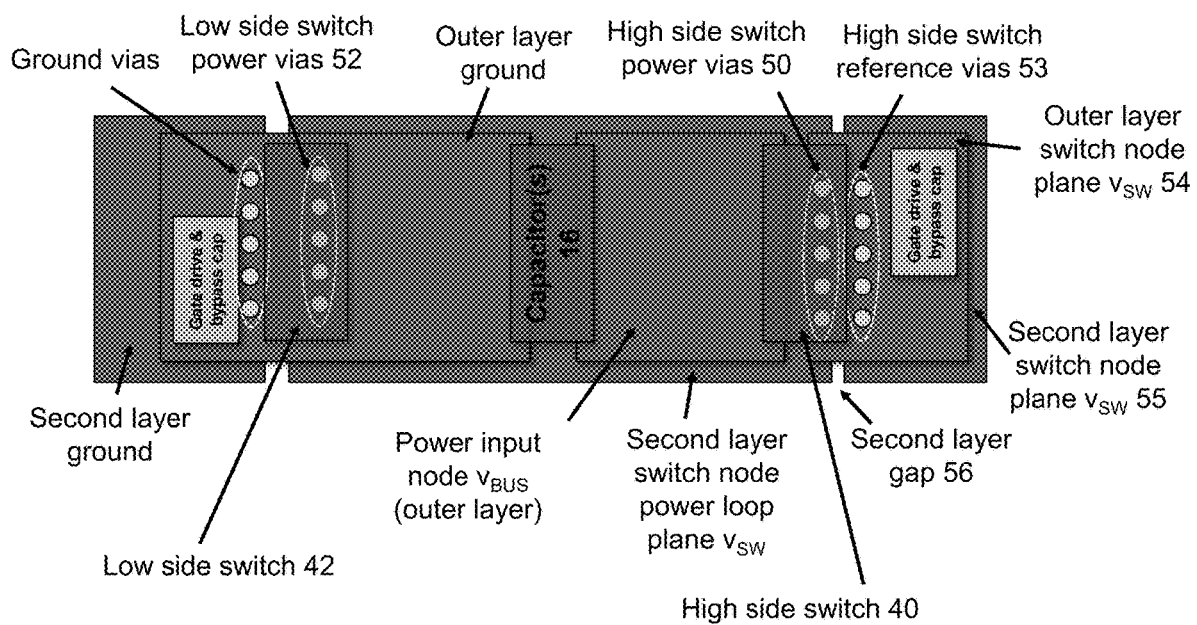
FIG. 10 shows the board layout for the half-bridge variant of FIG. 9.

FIG. 10 shows an implementation of the board layout for the half-bridge variant of FIG. 9. The high side transistor switch 40 ($Q_2$) and low side transistor switch 42 ($Q_1$) on the first (outer) layer connect to the switch node on the second layer through vias 50 and 52 adjacent to, or under, the respective switches. An optional gap 56 in the second layer switch node plane provides an additional second layer switch node plane 55 connected to the switch 50 by vias 53. This prevents the power loop current from flowing through the vias connecting to the gate drive reference plane 55, thus reducing the common inductance between the power loop and the high side gate drive loop, with similar benefits to those obtained for the low side switch. The third layer, if present, would be a ground or power plane with a constant DC voltage. As previously mentioned, the third layer performs a shielding function to reduce E-field EMI, and further reduces power loop inductance.

The half-bridge implementation in FIG. 10 also places the bus capacitor between the switches 40 and 42. This is advantageous in applications where switches 40 and 42 dissipate power as heat, since it increases the area over which the heat is generated, lowering the total thermal resistance from the switches 40 and 42 to the ambient environment and thus reducing their operating temperature. This reduced temperature operation has the advantages of increased efficiency and improved reliability.

In summary, the present invention, as set forth in the above-described embodiments, provides a low inductance circuit board layout for power switched circuits. The parallel wide conductors of the circuit board carrying the switch load current result in a low inductance path for the power loop. The power loop and gate loop current travel in different directions and are well separated, minimizing common source inductance (CSI) and maximizing switching speed. Power loop current and gate loop current are prevented from sharing circuit board vias, further reducing CSI. The outer layer of the circuit board minimizes the area of the switch node and maximizes the area with fixed (DC) voltages, thus reducing EMI due to electric field coupling. A ground plane on an optional third layer further reduces power loop inductance and EMI due to electric field coupling. Central mounting of the capacitor(s) allows the transistor switches to be farther apart, improving heat transfer from the switches to the environment and reducing operating temperatures.

The above description and drawings are only to be considered illustrative of specific embodiments, which achieve the features and advantages described herein. Modifications and substitutions to specific process conditions can be made. Accordingly, the embodiments of the invention are not considered as being limited by the foregoing description and drawings.

What is claimed as new and desired to be protected by Letters Patent of the United States is:

1. A circuit board for a circuit including at least one transistor switch, at least one gate drive, at least one load, and at least one capacitor, the circuit board comprising:
    a first layer on which the transistor switch, the load and the capacitor are mounted, the first layer being an outer layer of the circuit board, the capacitor being mounted between, and separated from, the load and the transistor switch, the first layer including first conductors for carrying switch load current in a first direction, and second conductors, spaced from the first conductors, for carrying gate drive current in a second direction, which is different from the first direction; and
    a second layer disposed adjacent the first layer, the second layer including conductors for carrying the switch load current in an opposite direction to the first direction.

2. The circuit board of claim 1, further comprising a plurality of vias for connecting the first conductors of the first layer with the conductors of the second layer, thereby forming a power loop extending through the first layer and the second layer.

3. The circuit board of claim 2, wherein the first layer and the second layer each comprise a ground plane, wherein the circuit board further comprises a plurality of ground vias connecting the ground plane of the first layer to the ground plane of the second layer.

4. The circuit board of claim 3, further comprising a third layer comprising a ground plane, wherein the ground plane of the third layer is connected to the ground plane of the first layer and the ground plane of the second layer by the ground vias.

5. The circuit board of claim 1, wherein the circuit is a single switch circuit.

6. The circuit board of claim 1, wherein the circuit is a half-bridge circuit.

7. The circuit board of claim 1, wherein the transistor switch is a GaN power transistor.

* * * * *